US012096631B2

(12) United States Patent
Zhang et al.

(10) Patent No.: US 12,096,631 B2
(45) Date of Patent: Sep. 17, 2024

(54) THREE-DIMENSIONAL NAND MEMORY DEVICE AND METHOD OF FORMING THE SAME

(71) Applicant: Yangtze Memory Technologies Co., Ltd., Hubei (CN)

(72) Inventors: Zhong Zhang, Wuhan (CN); Zhongwang Sun, Wuhan (CN); Wenxi Zhou, Wuhan (CN); Zhiliang Xia, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 854 days.

(21) Appl. No.: 17/113,492

(22) Filed: Dec. 7, 2020

(65) Prior Publication Data

US 2021/0358945 A1 Nov. 18, 2021

Related U.S. Application Data

(63) Continuation of application No. PCT/CN2020/090411, filed on May 15, 2020.

(51) Int. Cl.
*H10B 43/27* (2023.01)
*H10B 41/10* (2023.01)
(Continued)

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35; H10B 43/50; H10B 43/40
See application file for complete search history.

(56) References Cited

U.S. PATENT DOCUMENTS 9,941,209 B2 4/2018 Tessariol et al.
10,134,747 B2 11/2018 Lee
(Continued)

FOREIGN PATENT DOCUMENTS

CN 106409811 A 2/2017
CN 107342289 A 11/2017
(Continued)

OTHER PUBLICATIONS

Combined Chinese Office Action and Search Report issued Nov. 30, 2020, in Chinese Patent Application No. 202080001107.1 (with English translation of Categories of Cited Documents), citing documents AA and AO-AQ therein, 6 pages.
(Continued)

*Primary Examiner* — Herve-Louis Y Assouman
(74) *Attorney, Agent, or Firm* — Oblon, McClelland, Maier & Neustadt, L.L.P.

(57) ABSTRACT

In a method for fabricating a semiconductor device, an initial stack is formed. The initial stack is formed of sacrificial layers and insulating layers that are alternatingly disposed over a substrate, and includes a first connection region, a first array region, and a second connection region that are disposed sequentially. A first initial staircase is formed in the first connection region and formed in a first group of sacrificial layers and insulating layers. A first top select gate staircase is formed in the second connection region, and formed in a second group of sacrificial layers and insulating layers. An etching process is subsequently performed in the first connection region to shift the first initial staircase toward the substrate along a vertical direction perpendicular to the substrate so as to form a first bottom select gate staircase.

18 Claims, 10 Drawing Sheets

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/35*** | (2023.01) |
| ***H10B 43/40*** | (2023.01) |
| ***H10B 43/50*** | (2023.01) |

(56) References Cited

U.S. PATENT DOCUMENTS 10,290,581 B2 5/2019 Tessariol et al.
10,566,347 B2 2/2020 Lee
2014/0162420 A1* 6/2014 Oh ......................... H10B 43/27 438/270
2017/0256551 A1 9/2017 Lee
2017/0263556 A1 9/2017 Tessariol et al.
2017/0317088 A1 11/2017 Lee
2018/0204799 A1 7/2018 Tessariol et al.
2019/0051655 A1 2/2019 Lee
2019/0259703 A1 8/2019 Tessariol et al.
2020/0273874 A1 8/2020 Zhang et al.
2021/0151455 A1* 5/2021 Xu ........................ H01L 23/535

FOREIGN PATENT DOCUMENTS

CN 109496354 A 3/2019
CN 109671714 A 4/2019
CN 109983577 A 7/2019
CN 110534527 A 12/2019
CN 110867448 A 3/2020
TW 201639118 A 11/2016
TW 201843817 A 12/2018
TW 201939499 A 10/2019

OTHER PUBLICATIONS

International Search Report issued Feb. 19, 2021 in PCT/CN2020/090411, citing documents AA and AO through AR therein, 4 pages.

* cited by examiner

THREE-DIMENSIONAL NAND MEMORY DEVICE AND METHOD OF FORMING THE SAME

RELATED APPLICATION

This application is a bypass continuation of International Application No. PCT/CN2020/090411, filed on May 15, 2020. The entire disclosure of the prior application is hereby incorporated by reference in its entirety.

BACKGROUND

Flash memory devices have recently been through a rapid development. The flash memory devices are able to retain the stored data for a long period of time without applying a voltage. Further, the reading rate of the flash memory devices is relatively high, and it is easy to erase stored data and rewrite data into the flash memory devices. Thus, the flash memory devices have been widely used in micro-computers, automatic control systems, and the like. To increase the bit density and reduce the bit cost of the flash memory devices, three-dimensional (3D) NAND (Not AND) flash memory devices have been developed.

SUMMARY

In the present disclosure, embodiments directed to a method of manufacturing a 3D NAND device are provided. The embodiments include a method that forms bottom select gate (BSG) staircases and top select gate (TSG) staircases with connection staircases in a same time.

In the present disclosure, a method for fabricating a semiconductor device is provided. In the method, an initial stack can be formed. The initial stack is formed of sacrificial word line layers (also referred to as sacrificial layers) and insulating layers that are alternatingly disposed over a substrate. The initial stack can include a first connection region, a first array region, and a second connection region that are disposed sequentially along a first direction of the substrate. A first initial staircase can then be disposed in the first connection region of the initial stack of sacrificial word line layers and insulating layers, and formed in a first group of sacrificial word line layers and insulating layers. A first top select gate (TSG) staircase can be disposed in the second connection region of the initial stack of sacrificial word line layers and insulating layers, and formed in a second group of sacrificial word line layers and insulating layers. An etching process can be subsequently performed in the first connection region to shift the first initial staircase toward the substrate along a vertical direction perpendicular to the substrate so as to form a first bottom select gate (BSG) staircase.

In the method, at least one stop layer can be formed on the initial stack, where the at least one stop layer can define the first connection region, the first array region, and the second connection region in the initial stack. A trim-etch process can subsequently be performed based on the at least one stop layer to form a plurality of wall structures, and initial connection staircases in the second connection region. The wall structures can be covered by the at least one stop layer, and the initial connection staircases can be uncovered and arranged between the wall structures along a second direction of the substrate that is perpendicular to the first direction.

In some embodiments, the etching process can be performed on the first group of the sacrificial word line layers and the insulating layers and the second group of the sacrificial word line layers and the insulating layers of the first initial staircase to shift the first initial staircase to one or more bottom most sacrificial word line layers and bottom most insulating layers, and to shift the initial connection staircases towards the substrate along the vertical direction to form connection staircases. Each of the staircases can be formed in respective sacrificial layers and insulating layers of the initial stack.

In the method, a plurality of chop processes can be sequentially performed to shift the first initial staircase in the first connection region towards the substrate to form the first BSG staircase. A first chop process of the chop processes can shift the first initial staircase by a first number of steps towards the substrate. A second chop process of the chop processes subsequent to the first chop process can shift the first initial staircase by a second number of steps that is as twice as the first number of steps.

In the method, the chop processes can further be applied on the initial connection staircases in the second connection region to shift the initial connection staircases towards the substrate so as to form the connection staircases, where each of the initial connection staircases can receive respective number of chop processes so that each of the initial connection staircases can be shifted in respective sacrificial layers and insulating layers.

In the method, first separation structures can be formed. The first separation structures can extend through the first connection region, the first array region, and the second connection region. The first separation structures can be formed along the first direction and extend through the initial stack into the substrate. In addition, second separation structures can be formed in the first array region. The second separation structures can be disposed along the first direction, and positioned between the first separation structures. The second separation structures can further extend through the initial stack into the substrate, and extend through the first BSG staircase and the first TSG staircase.

In the method, channel structures can be formed in the first array region of the initial stack. The channel structures can extend through the initial stack into the substrate along the vertical direction.

In some embodiments, the initial stack can further include a second array region and a third connection region. The second array region can be positioned between the second connection region and the third connection region. Accordingly, a second initial staircase can be formed in the third connection region, and a second TSG staircase can be formed in the second connection region. The first initial staircase and the second initial staircase can be formed in the first group of the sacrificial word line layers and the insulating layers. The first TSG staircase, the second TSG staircase and the initial connection staircases can be formed in the second group of the sacrificial word line layers and the insulating layers. The etching process thus can be performed to shift the first initial staircase, the second initial staircase, and the initial connection staircases towards the substrate along the vertical direction so as to form the first BSG staircase in the first connection region, a second BSG staircase in the third connection region, and the connection staircases in the second connection region.

Accordingly, the first TSG staircase, the connection staircases, and the second TSG staircase can extend along the first direction, and the connection staircases can be disposed between the first TSG staircase and the second TSG staircase. The first separation structure can further extend through the second array region and the third connection region.

In the method, third separation structures can be formed in the second array region. The third separation structures can be disposed along the first direction, and positioned between the first separation structures. The third separation structures can further extend through the initial stack into the substrate, and extend through the second BSG staircase and the second TSG staircase.

According to another aspect of the disclosure, a method for fabricating a semiconductor device is provided. In the method, an initial stack can be formed. The initial stack is formed of sacrificial word line layers and insulating layers that are alternatingly disposed over a substrate. The initial stack of sacrificial word line layers and insulating layers can include a first connection region, a first array region, a second connection region, a second array region, and a third connection region that are disposed sequentially along a first direction of the substrate. A first initial staircase can be formed in the first connection region and a second initial staircase can be formed in the third connection region. The first initial staircase and the second initial staircase can be formed in a first group of the sacrificial word line layers and the insulating layers. In addition, a first top select gate (TSG) staircase can be formed in the second connection region along the first array region and a second TSG staircase can be formed in the second connection region along the second array region. The first TSG staircase and the second TSG staircase can be formed in a second group of the sacrificial word line layers and the insulating layers. An etching process can be subsequently performed in the first connection region and the third connection region to shift the first initial staircase and the second initial staircase toward the substrate along a vertical direction perpendicular to the substrate so as to form a first bottom select gate (BSG) staircase in the first connection region and a second BSG staircase in the third connection region.

In the method, at least one stop layer can be formed on the initial stack, where the at least one stop layer can define the first connection region, the first array region, the second connection region, the second array region, and the third connection region in the initial stack. Further, a trim-etch process can be performed based on the at least one stop layer to form a plurality of wall structures, and initial connection staircases in the second connection region. The wall structures and the initial connection staircases can be positioned between the first array region and the second array region. The wall structures can be covered by the at least one stop layer, and the initial connection staircases can be uncovered and further arranged between the wall structures.

In some embodiments, the etching process can be performed on the first group of the sacrificial word line layers and the insulating layers of the first initial staircase and the second initial staircase. The etching process thus can shift the first initial staircase and the second initial staircase to one or more bottom most sacrificial word line layers and bottom most insulating layers. The etching process can also be performed on the second group of the sacrificial layers and the insulating layers to shift the initial connection staircases towards the substrate along the vertical direction to form connection staircases, where each of the connection staircases can be formed in respective sacrificial layers and insulating layers of the initial stack.

In some embodiments, a plurality of chop processes can be sequentially performed to shift the first initial staircase and the second initial staircase towards the substrate to form the first BSG staircase and the second BSG staircase respectively. A first chop process of the chop processes can shift the first initial staircase and the second initial staircase by a first number of steps respectively towards the substrate. A second chop process of the chop processes subsequent to the first chop process can shift the first initial staircase and the second initial staircase by a second number of steps respectively, where the second number of steps is as twice as the first number of steps.

The chop processes can further be applied on the initial connection staircases in the second connection region to shift the initial connection staircases towards the substrate so as to form the connection staircases, where each of the initial connection staircases can receive respective number of chop processes so that each of the initial connection staircases is shifted in respective sacrificial layers and insulating layers.

According to yet another aspect of the disclosure, a semiconductor device is provided. The semiconductor device can have a first bottom select gate (BSG) staircase, a first array region, a connection region, a second array region, and a second BGS staircase that are formed in a stack and disposed sequentially along a first direction of a substrate. The stack can be formed of word line layers and insulating layers that are alternatingly disposed over a substrate. The first BSG staircase can be formed in a first group of the word line layers and the insulating layers, and the second BSG staircase can be formed in a second group of the word line layers and the insulating layers. The connection region includes a first top select gate (TSG) staircase positioned along the first array region, and a second TSG staircase positioned along the second array region. The first TSG staircase can be formed in a third group of the word line layers and the insulating layers, and the second TSG staircase can be formed in a fourth group of the word line layers and the insulating layers. The first TSG staircase and the second TSG staircase are positioned above the first BSG staircase and the second BSG staircase.

In the semiconductor device, first separation structures can extend through the first BSG staircase, the first array region, the connection region, the second array region, and the second BSG staircase. The first separation structures can further extend through the stack into the substrate and extend along the first direction. The semiconductor device can have second separation structures extending through the first array region. The second separation structures can be disposed along the first direction, and positioned between the first separation structures. The second separation structures can extend through the stack into the substrate, and further extend through the first BSG staircase and the first TSG staircase. The semiconductor device can further include third separation structures. The third separation structures can extend through the second array region. The third separation structures can be disposed along the first direction, and positioned between the first separation structures. The third separation structures can extend through the stack, and further extend through the second BSG staircase and the second TSG staircase.

In some embodiments, the connection region can further include a plurality of wall structures, and connection staircases. The connection staircases can be arranged between the wall structures along a second direction of the substrate that is perpendicular to the first direction. The connection staircases can be arranged between the first TSG staircase and the second TSG staircase along the first direction. Each of the connection staircases can be formed in respective word line layers and insulating layers of the stack.

In the semiconductor device, at least one of the connection staircases includes a first group of stairs and a second group of stairs. The first group of stairs can extend along the first direction, and the second group of stairs can extend along a third direction, where the first direction is opposite to the third direction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
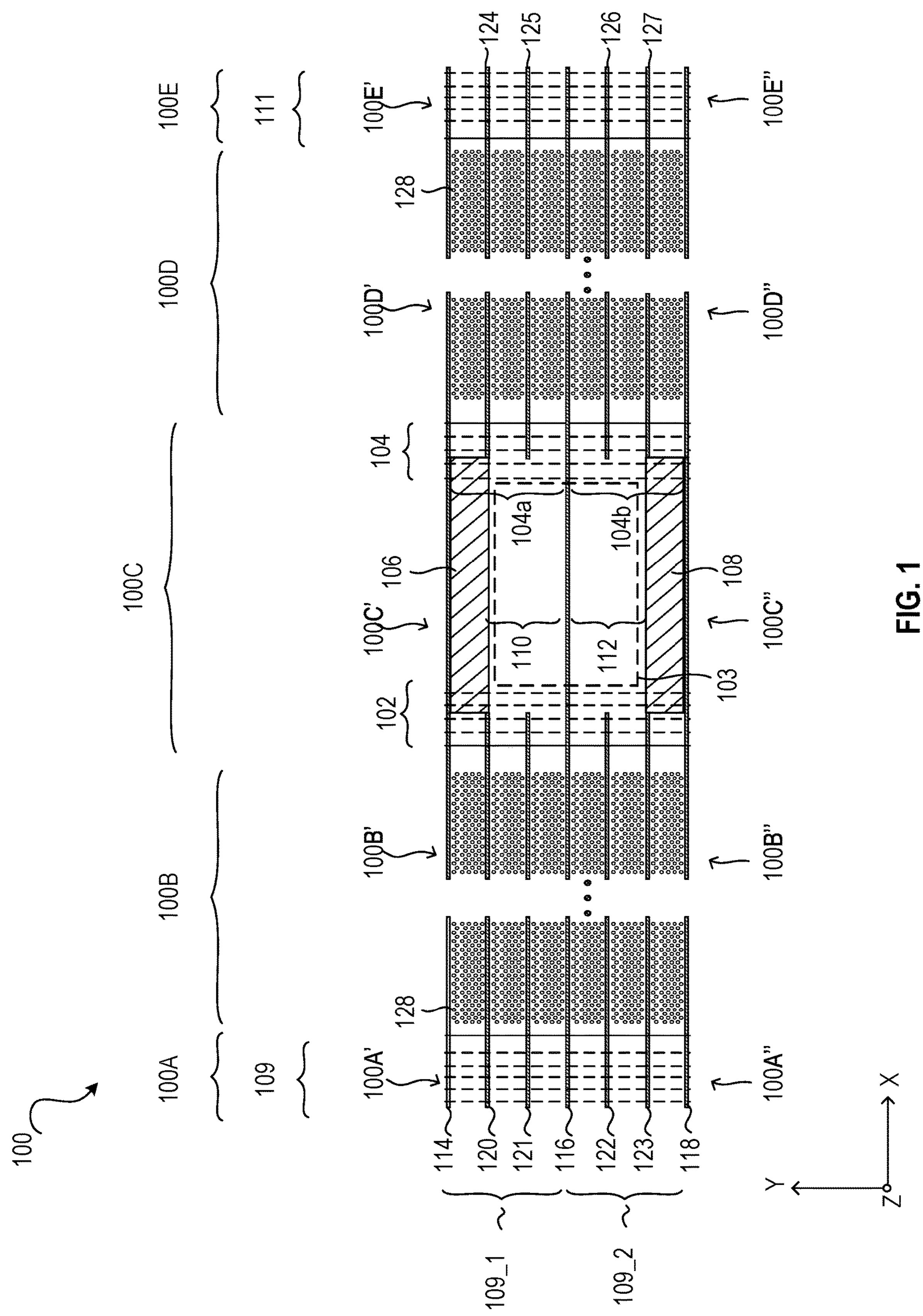
FIG. 1 is a top down view of a 3D NAND device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A 3D NAND device can include one or more memory planes, and each of the one or more memory planes can include a plurality of memory blocks. Each of the one or more memory blocks can have a connection region that is positioned between two array regions. The connection region and the array regions are formed in a stack of word line layers and insulating layers that are disposed alternatingly over a substrate. The word line layers can include bottom select gate (BSG) layers, gate layers (or word line layers), and top select gate (TSG) layers that are disposed sequentially over the substrate. The array regions can include a plurality of channel structures. Each of the channel structures can be coupled to the word line layers to form a respective vertical NAND memory cell string. The vertical NAND memory cell string can include one or more bottom select transistors (BSTs), a plurality of memory cells (MCs), and one or more top select transistors (TSTs) that are disposed sequentially and in series over the substrate along a height direction (or Z direction) of the substrate. The BSTs can be formed of the channel structure and the BSG layers, the MCs can be formed of the channel structure and the word line layers, and the TSTs can be formed of the channel structure and the TSG layers.

In such a 3D NAND device, the connection region can include stairs that can be formed in the BSG layers, the word line layers, and the TSG layers. Word line contacts can further be formed on the stairs to connect to the BSG layers, the word line layers, and the TSG layers. In the 3D NAND device, the stairs in the word line layers (also referred to as a connection staircase) can be formed via a stair divided scheme (SDS), where the stairs can have one or more step-down directions in order to save processing time. However, the stairs in the TSG layers (also referred to as a TSG staircase) and the stairs in the BSG layers (also referred to as a BSG staircase) cannot be formed through the SDS because one or more TSG-cut structures and BSG-cut structures are normally formed in the TSG layers and BSG layers respectively to divide the TSG layers and BSG layers into sub-TSG layers and SUB-BSG layers respectively. Thus, the stairs in the TSG layers and in the BSG layers, and the stairs in the word line layers are normally formed separately.

In the disclosure, a manufacturing method is provided. In the method, an initial BSG staircase, initial connection staircases and a TSG staircase can be formed in a same time in the stack through one or more trim-etch processes. One or more removal processes (e.g., chop processes such as blanket dry etch processes) can subsequently be applied to shift the initial BSG staircase to one or more bottom word line layers (e.g., bottom most word line layers) and bottom insulating layers (e.g., bottom most insulating layers) so as to form the BSG staircase. The removal processes can also shift the initial connection staircases toward the substrate to form connection staircases, where each of the connection staircases can be formed in respective word line layers and insulating layers of the stack. The method of the disclosure can not only gain a throughput improvement but also gain a cost reduction.

FIG. 1 is a top down view of a 3D NAND device 100 (also referred to as device 100), in accordance with exemplary embodiments of the disclosure. As shown in FIG. 1, the device 100 can have a first connection region 100A, a first array region 100B, a second connection region 100C, a second array region 100D, and a third connection region 100E that are disposed sequentially along a first direction (e.g., X direction) of a substrate (not shown). The first connection region 100A, the first array region 100B, the second connection region 100C, the second array region 100D, and the third connection region 100E can be formed in a stack of word line layers and insulating layers that are alternatingly disposed over the substrate. The first connection region 100A can include a first BSG staircase 109 that is formed in a first group of the word line layers and the insulating layers adjacent to the substrate, for example, in one or more bottom most word line layers and bottom most insulating layers adjacent to the substrate. Similarly, the third connection region 100E can include a second BSG staircase 111 that can also be formed in the first group of the word line layers and the insulating layers that are adjacent to the substrate.

The second connection region 100C can be positioned between the first array region 100B and the second array region 100D. The second connection region 100C can include a first TSG staircase 102 that is positioned adjacent to the first array region 100B, and a second TSG staircase 104 that is positioned adjacent to the second array region 100D. The second connection region 100C can also include a first wall structure 106, a second wall structure 108, and a plurality of connection staircases 103. The first TSG staircase 102, the connection staircases 103, and the second TSG staircase 104 are arranged along the X direction sequentially. The first TSG staircase 102, the connection staircases 103, and the second TSG staircase 104 are also disposed between the first wall structure 106 and the second wall structure 108 along a Y direction of the substrate. The first TSG staircase 102 and the second TSG staircase 104 can be formed in a second group of the word line layers and the insulating layers, for example, in one or more top word line layers and top insulating layers. In addition, each of the connection staircases 103 can be formed in respective word line layers and insulating layers of the stack.

The device 100 can include a first separation structure 114 positioned along first sides of the first connection region 100A, the first array region 100B, the second connection region 100C, the second array region 100D, and the third connection region 100E. The first separation structure 114 can extend through the stack into the substrate and extend along the first direction (e.g., X direction). As shown in FIG. 1, the first side of the first connection region 100A can be 100A', the first side of the first array region 100B can be 100B', the first side of the second connection region 100C can be 100C', the first side of the second array region 100D can be 100D', and the first side of the third connection region 100E can be 100E'.

The device 100 can have a second separation structure 116 extending through the first connection region 100A, the first array region 100B, the second connection region 100C, the second array region 100D, and the third connection region 100E. The second separation structure 116 can be formed along the first direction and extend through the stack into the substrate. In some embodiments, the connection staircases 103 can be separated by the second separation structure 116 into first connection staircases 110 and second connection staircases 112. The second separation structure 116 can further divide the first BSG staircase 109 into a BSG staircase 109_1 and a BSG staircase 109_2.

The device 100 can include a third separation structure 118 positioned along second sides of the first connection region 100A, the first array region 100B, the second connection region 100C, the second array region 100D, and the third connection region 100E. The third separation structure 118 can further extend through the stack into the substrate and extend along the first direction. As shown in FIG. 1, the second side of the first connection region 100A can be 100A", the second side of the first array region 100B can be 100B", the second side of the second connection region 100C can be 100C", the second side of the second array region 100D can be 100D", and the second side of the third connection region 100E can be 100E".

In some embodiments, the first separation structure 114, the second separation structure 116, and the third separation structure 118 can be gate line slit (GLS) structures. In some embodiments, the GLS structures can be made of conductive materials and positioned on array common source (ACS) regions to serve as contacts, where the ACS regions are formed in the substrate to serve as common sources. In some embodiments, the GLS structures can be made of dielectric materials to serve as separation structures. In some embodiments, a gate-last fabrication technology is used to form the device 100. Thus, the GLS structures are formed to assist in the removal of sacrificial word line layers (also referred to as sacrificial layers), and the formation of the real gates.

The device 100 can include first array separation structures (or first array GLS structures) 120-123 in the first array region 100B. The first array separation structures 120-123 can be disposed along the first direction (e.g., X direction), and positioned between the first separation structure 114 and the third separation structure 118. The first array separation structures 120-123 can extend through the stack into the substrate, and further extend through the first BSG staircase 109 and the first TSG staircase 102. The device 100 can also include second array separation structures (or second array GLS structures) 124-127 that are disposed along the first direction, and positioned between the first separation structure 114 and the third separation structure 118. The second array separation structures 124-127 can extend through the stack into the substrate, and further extend through the second BSG staircase 111 and the second TSG staircase 104.

The device 100 can also include a plurality of channel structures 128 that are positioned in the first array region 100B and the second array region 100D. The channel structures 128 can extend through the stack into the substrate. Each of the channel structures 128 can further include a channel layer, a tunneling layer that surrounds the channel layer, a charge trapping layer that surrounds the tunneling layer, and a barrier layer that surrounds the charge trapping layer. Further, the channel structures 128 can be in direct contact with the word line layers. In some embodiments, a high-K layer, such as $HfO_2$ or AlO, can be disposed between the word line layers and the barrier layer.

In some embodiments, two memory blocks can be formed in FIG. 1, where a first memory block can be defined between the first separation structure 114 and the second separation structure 116, and a second memory block can be defined between the second separation structure 116 and the third separation structure 118. For example, as shown in FIG. 1, the first wall structure 106, the first connection staircases 110, and the BSG staircase 109_1 are included in the first memory block. The second wall structure 108, the second connection staircase 112, and the BSG staircase 109_2 are included in the second memory block. In addition, the first array separation structures 120-121 and the second array separation structure 124-125 can divide the first memory block into three sub-blocks (or three finger structures). The first array separation structures 122-123 and the second array separation structure 126-127 can divide the second memory block into three sub-blocks (or three finger structures).

Figure 2:
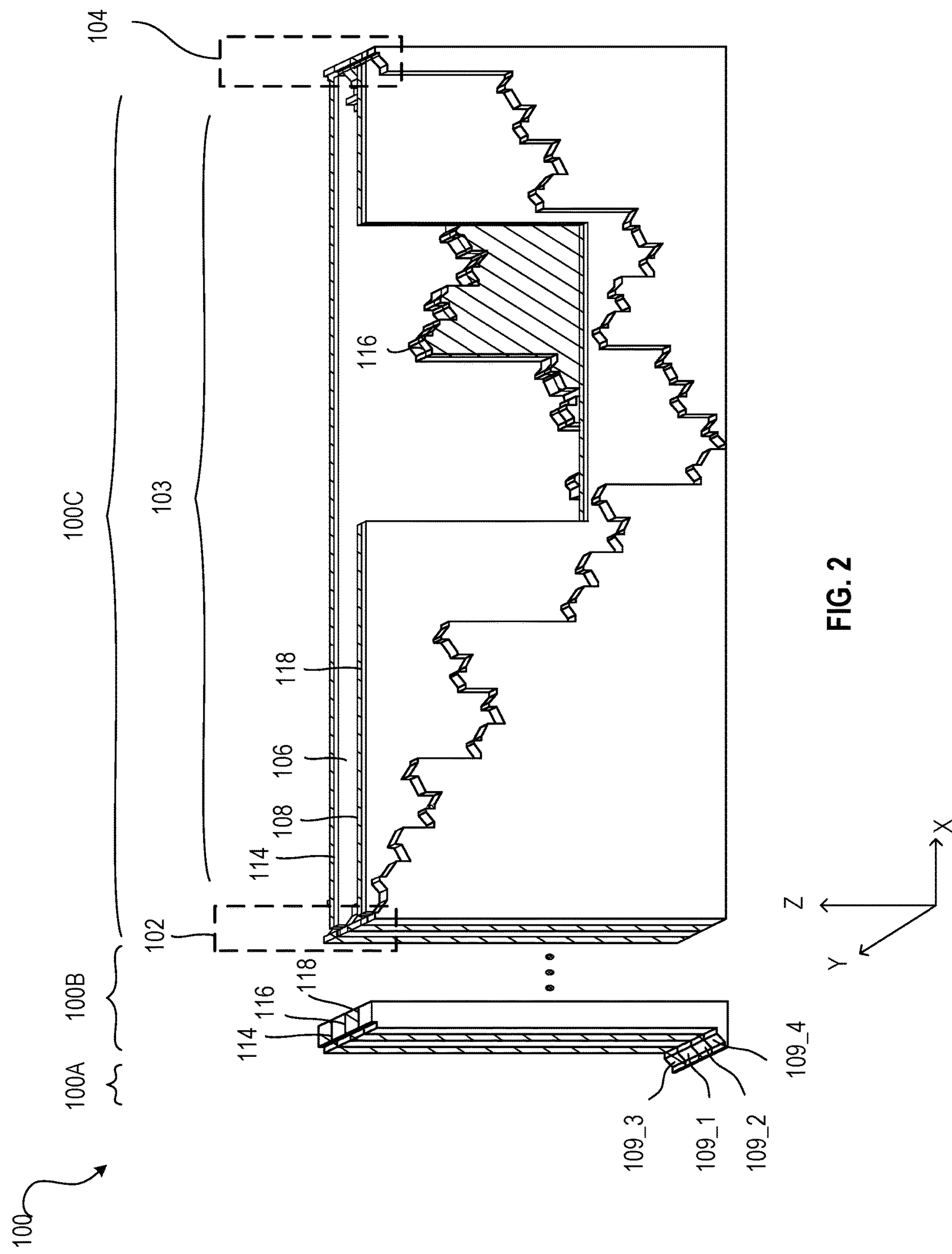
FIG. 2 is a three-dimensional view of a 3D NAND device, in accordance with exemplary embodiments of the disclosure.

FIG. 2 is a three-dimensional view of the device 100, in accordance with exemplary embodiments of the disclosure. For simplicity and clarity, the first connection region 100A, the first array region 100B, and the second connection region 100C are shown in FIG. 2. In FIG. 2, four memory blocks are provided, and the two memory blocks of FIG. 1 are positioned in the middle of the four memory blocks. As shown in FIG. 2, the first separation structure 114 is positioned in the first connection region 100A, the first array region 100B, and the second connection region 100C. The third separation structure 118 is positioned in the first connection region 100A, the first array region 100B, and the second connection region 100C. The second separation structure 116 extends through the first connection region 100A, the first array region 100B, and the second connection region 100C along the X direction. Separation structures (e.g., the first separation structure 114, the second separation structure 116, and the third separation structure 118) can divide the device 100 into a plurality of memory blocks. For example, four memory blocks are illustrated in FIG. 2, where the first BSG staircase 109 is separated into four staircases (or four sub-BSG staircases) 109_1 to 109_4 by the first separation structure 114, the second separation structure 116, and the third separation structure 118. Each of the four staircases 109_1 to 109_4 can be included in a respective memory block.

Still referring to FIG. 2, the first BSG staircase 109 can be formed in one or more bottom word line layers and bottom insulating layers, such as bottom most word line layers and bottom most insulating layers that are adjacent to the substrate. The first TSG staircase 102 is positioned along the first array region 100B, and formed in one or more top word line layers and top insulating layers. The second TSG staircase 104 is positioned along the second array region 100D (not shown) and also formed in the one or more top word line layers and top insulating layers. The connection staircases 103 are positioned between the first TSG staircase 102 and the second TSG staircase 104. Each of the connection staircases 103 is formed in respective word line layers and insulating layers.

Figure 3:
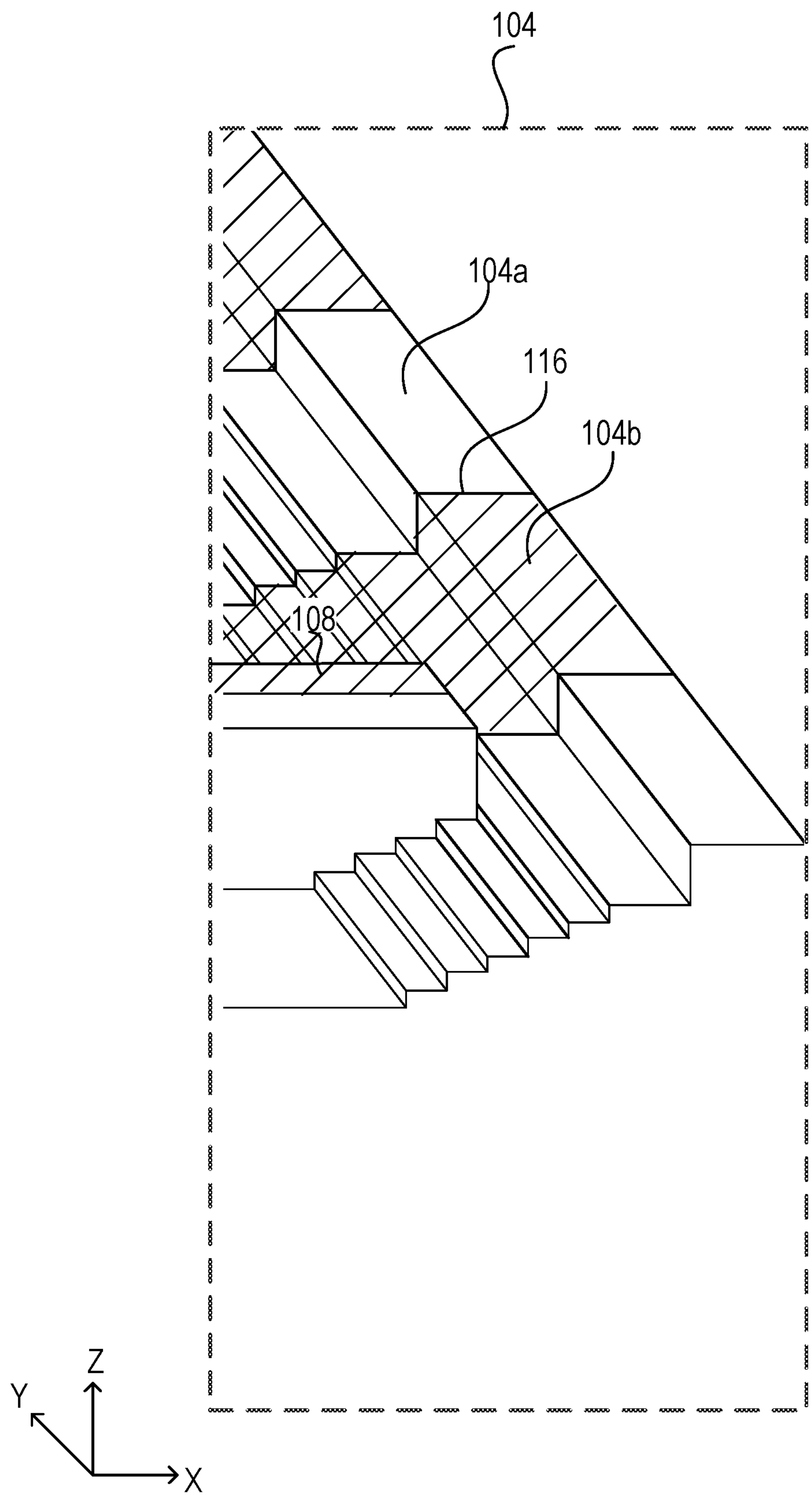
FIG. 3 is an expanded three-dimensional view of a 3D NAND device, in accordance with exemplary embodiments of the disclosure.

FIG. 3 is an expanded three-dimensional view of the second TSG staircase 104 in the device 100, in accordance with exemplary embodiments of the disclosure. As shown in FIG. 3, the second TSG staircase 104 can be divided into two TSG staircases 104*a* and 104*b* by the second separation structure 116. The TSG staircase 104*a* can be included in a first memory block and the TSG staircase 104*b* can be included in a second memory block respectively. The second TSG staircase 104 can include one or more stairs, and each stair can include a respective pair of a word line layer and an insulating layer. In an exemplary embodiment of FIG. 3, the second TSG staircase 104 can include seven stairs.

Figure 4:
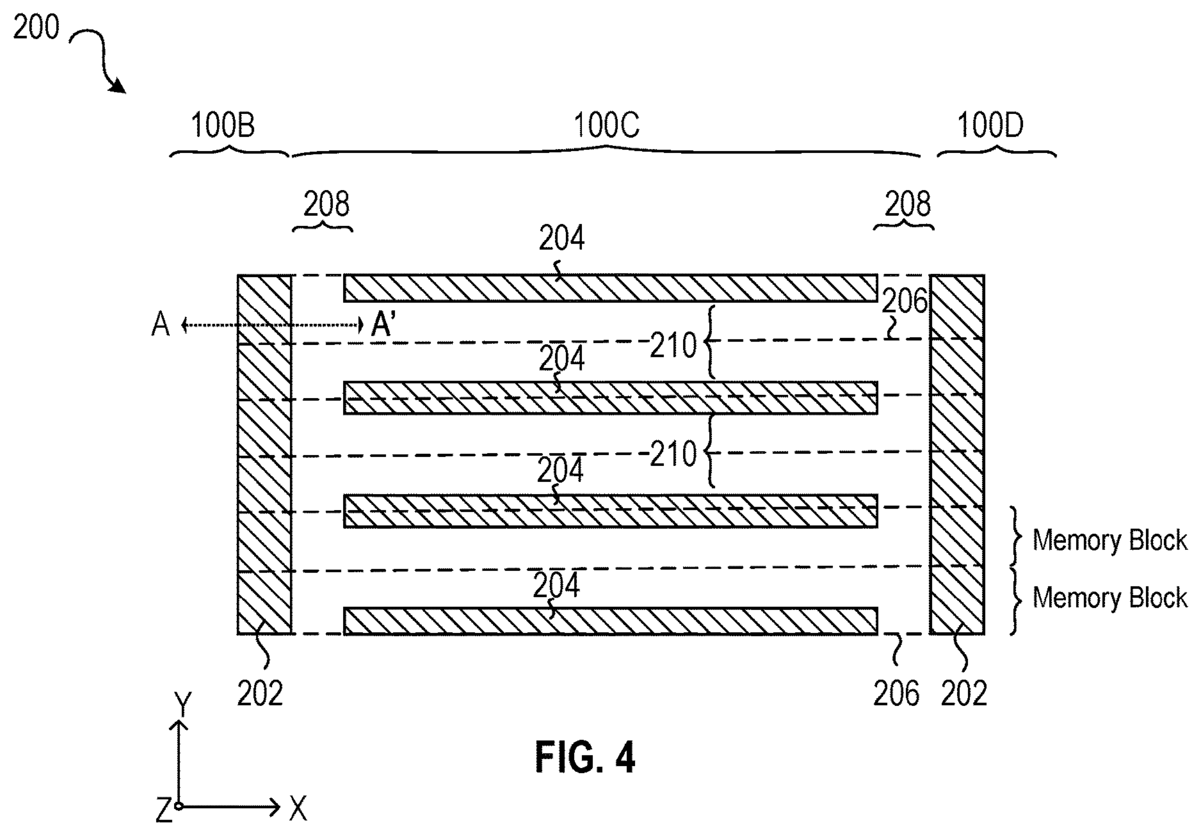
FIGS. 4, 5, 6, 7, 8, 9A, 9B, and 10 include cross-sectional, top down, and three-dimensional views of various intermediate steps of manufacturing a 3D NAND device, in accordance with exemplary embodiments of the disclosure.
Figure 5:
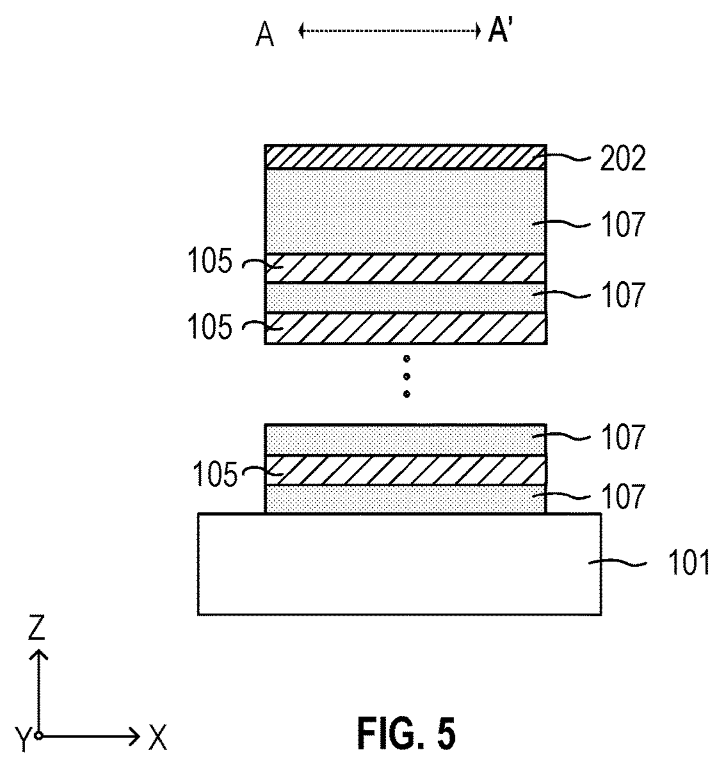

FIGS. 4-11 include cross-sectional, top down, and three-dimensional views of various intermediate steps of manufacturing a 3D NAND device, in accordance with exemplary embodiments of the disclosure. As shown in FIG. 4, a semiconductor structure 200 (also referred to as structure 200) is provided. The semiconductor structure 200 can include an initial stack that is formed of sacrificial word line layers (or sacrificial layers) 105 and insulating layers 107 over a substrate 101 as shown in FIG. 5. A plurality of mask layers (also referred to as blocking layers, or stop layers) 202 and 204 can be deposited on the structure 200. The mask layers 202 can be positioned along a Y direction of the substrate 101, and the mask layers 204 can be positioned along an X direction of the substrate 101. In some embodiments, array regions (e.g., the first array region 100B) can be formed based on portions of the structure 200 that are covered by the mask layers 202, and a connection region (e.g., the second connection region 100C) can be formed between the mask layers 202. In addition, wall structures (e.g., the first wall structure 106) can be formed based on portions of the structure 200 that are covered by the mask layers 204. TSG staircases (e.g., the first TSG staircase 102) can be formed in gaps 208 between the mask layers 202 and the mask layers 204. Connection staircases (e.g., the connection staircases 103) can be formed in gaps 210 between the mask layers 204. In addition, separation structures (e.g., the first separation structure 114) can be formed in dash lines 206. Accordingly, a plurality of memory blocks can be defined by the separation structures.

FIG. 5 is a cross-sectional view of the structure 200 that is obtained from a plane same as a vertical plane containing line A-A' in FIG. 4. As shown, the structure 200 can include the initial stack of sacrificial word line layers 105 and insulating layers 107 that are disposed alternatingly over the substrate 101. The initial stack can include bottom most sacrificial word line layers and bottom most insulating layers that are adjacent to the substrate 101. The initial stack can also include top sacrificial word line layers and top insulating layers that are adjacent to the mask layers 202. The initial stack can include any number of sacrificial word line layers and insulating layers according to the structure of the 3D NAND device. The mask layers 202 can be positioned on a top surface of the initial stack. In some embodiments, the mask layers 202 and 204 can include TiN, polysilicon, a high-K dielectric material, or another suitable blocking material during a dry etching process. The sacrificial word line layers 105 can be made of SiN, and the insulating layers 107 can be made of SiO, for example. Any suitable manufacturing processes can be applied to form the sacrificial word line layers 105, the insulating layers 107, and the mask layers 202 and 204, such as a chemical vapor deposition (CVD) process, a physical vapor deposition (PVD) process, an atomic layer deposition (ALD) process, a diffusion process, a sputter process, or a combination thereof.

Figure 6:
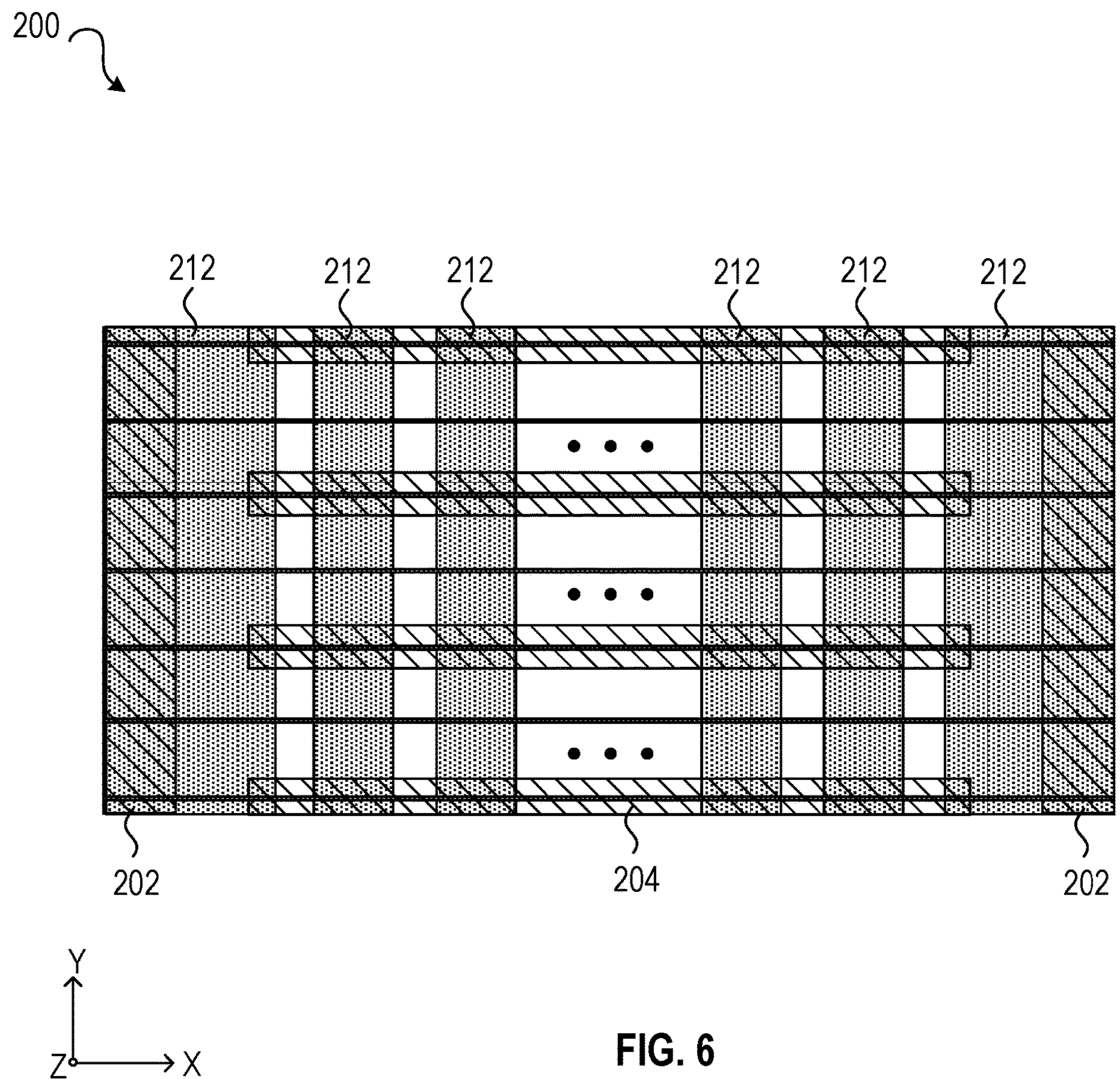

In FIG. 6, a plurality of trim-etch processes can be operated along the X direction to form a plurality of staircases. As shown in FIG. 6, in order to operate the trim-etch processes, resist layers 212 can be formed on the initial stack and the mask layers 202 and 204 through a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or a combination thereof. The resist layers 212 can be positioned along the Y direction of the substrate 101 and further cover the mask layers 204. In some embodiments, the resist layers 212 can be formed sequentially along the X direction, and the trim-etch processes accordingly can be operated sequentially along the X direction to form the staircases. In some embodiments, the resist layers 212 can be formed in a same time by the lithography process, and the trim-etch processes accordingly can be operated simultaneously to form the staircases.

Figure 7:
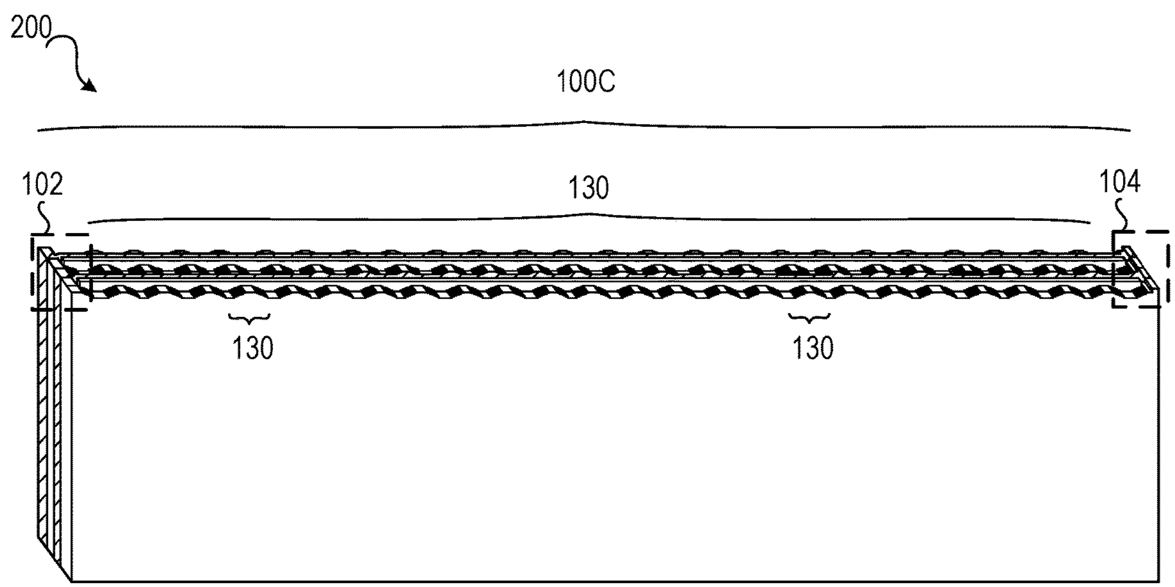

FIG. 7 is a three dimensional view of the structure 200 in the connection region (e.g., the second connection region 100C). As shown in FIG. 7, when the trim-etch processes are completed, a plurality of staircases can be formed. For example, a first TSG staircase 102 can be formed at a first end of the second connection region 100C adjacent to the first array region 100B (not shown), a second TSG staircase 104 can be formed at an opposing second end of the second connection region 100C, and a plurality of initial connection staircases 130 can be positioned between the first TSG staircase 102 and the second TSG staircase 104.

Figure 8:
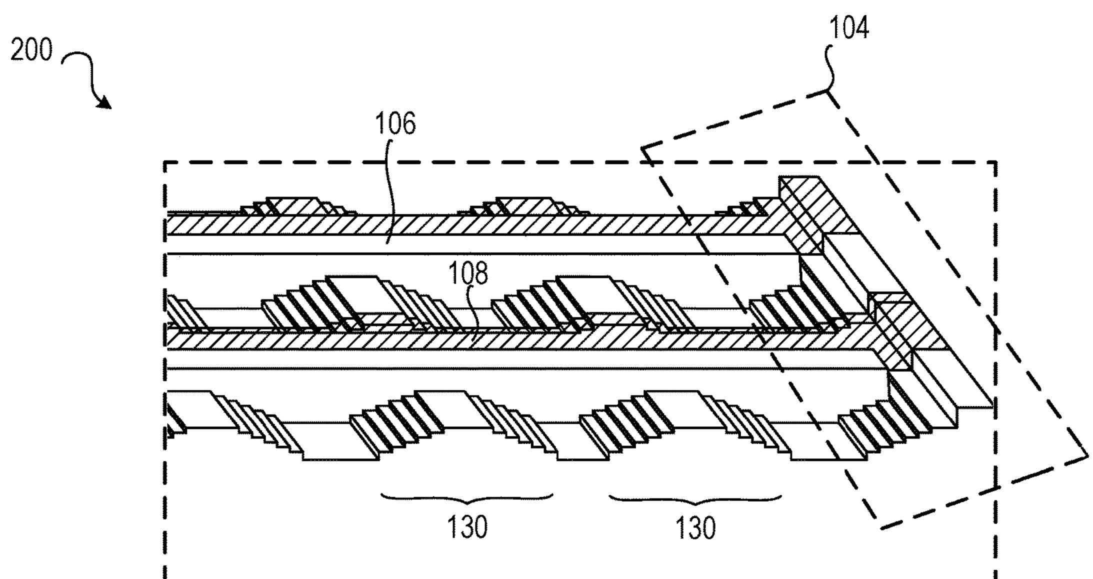

FIG. 8 is an expanded three dimensional view of the structure 200 in the connection region (e.g., the second connection region 100C). As shown in FIG. 8, the initial connection staircases 130 can be positioned between wall structures, including for example the first wall structure 106 and the second wall structure 108. The initial connection staircases 130 can extend along the X direction and be positioned between the first TSG staircase 102 (not shown) and the second TSG staircase 104. In some embodiments, the first TSG staircase 102, the initial connection staircases 130, and the second TSG staircase 104 can be formed in one or more top sacrificial word line layers and top insulating layers. In an embodiment of FIG. 8, the first TSG staircase 102, the initial connection staircases 130, and the second TSG staircase 104 are formed in seven pairs of top sacrificial word line layers and top insulating layers. Thus, seven stairs can be formed in the first TSG staircase 102, each of the initial connection staircases 130, and the second TSG staircase 104, respectively.

In some embodiments, the first TSG staircase 102 can have stairs extending along the X direction, and the second TSG staircase 104 can have stairs extend along a −X direction that is opposite to the X direction. Each of the initial connection staircases 130 can have a first group of stairs (e.g., first seven stairs) extending along the X direction and a second group of stairs (e.g., second seven stairs) extending along the −X direction.

In an example of FIG. 8, the first group of stairs can have seven stairs along the X direction and the second group of stairs can also have seven stairs along the −X direction. It should be noted that a first initial BSG staircase (not shown) and a second initial BSG staircase (not shown) can also be formed in one or more top sacrificial word line layers and top insulating layers. The first initial BSG staircase can be positioned adjacent to the first array region 100B, and the second initial BSG staircase can be positioned adjacent to the second array region 100D.

Figure 9A:
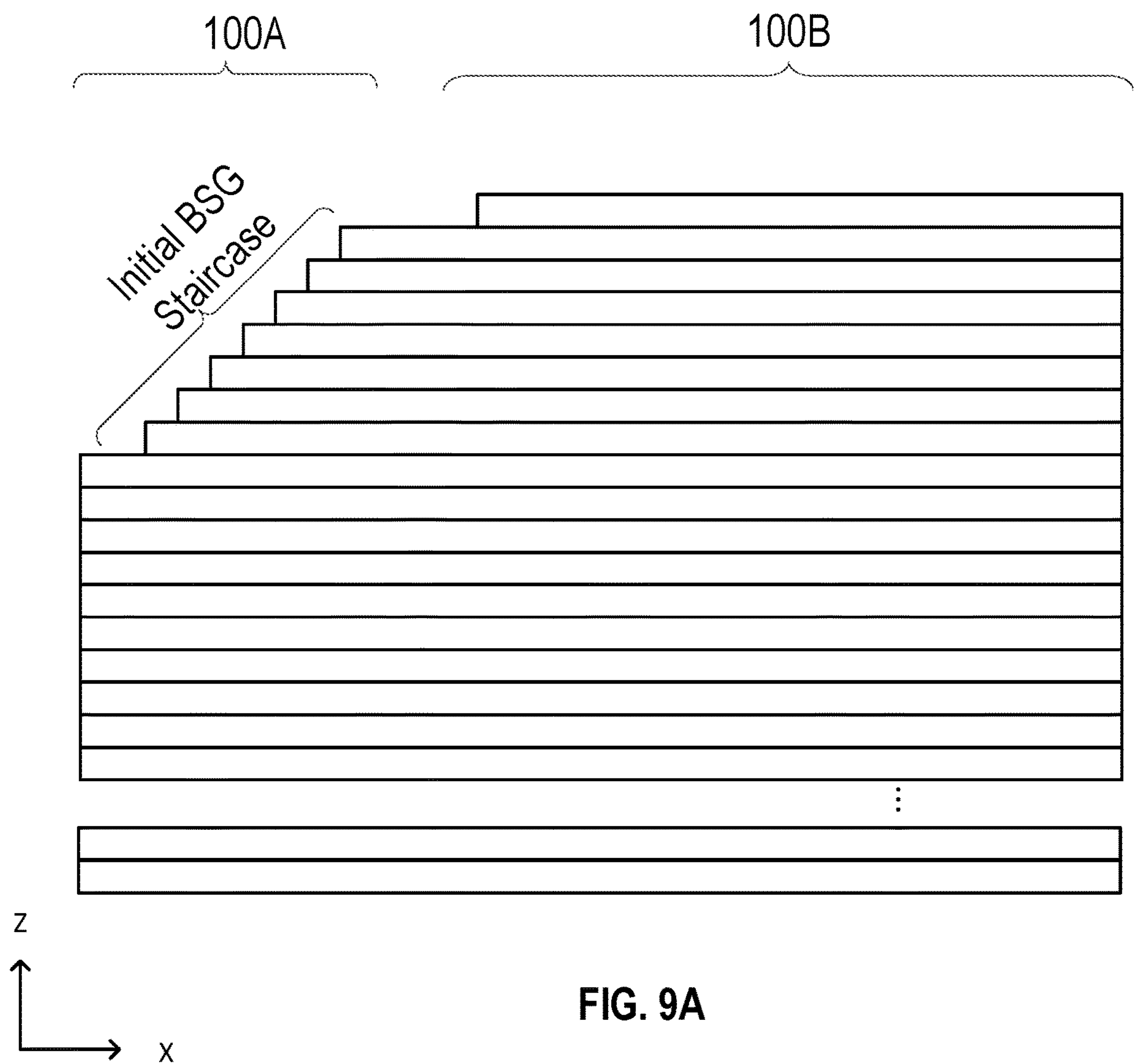
Figure 9B:
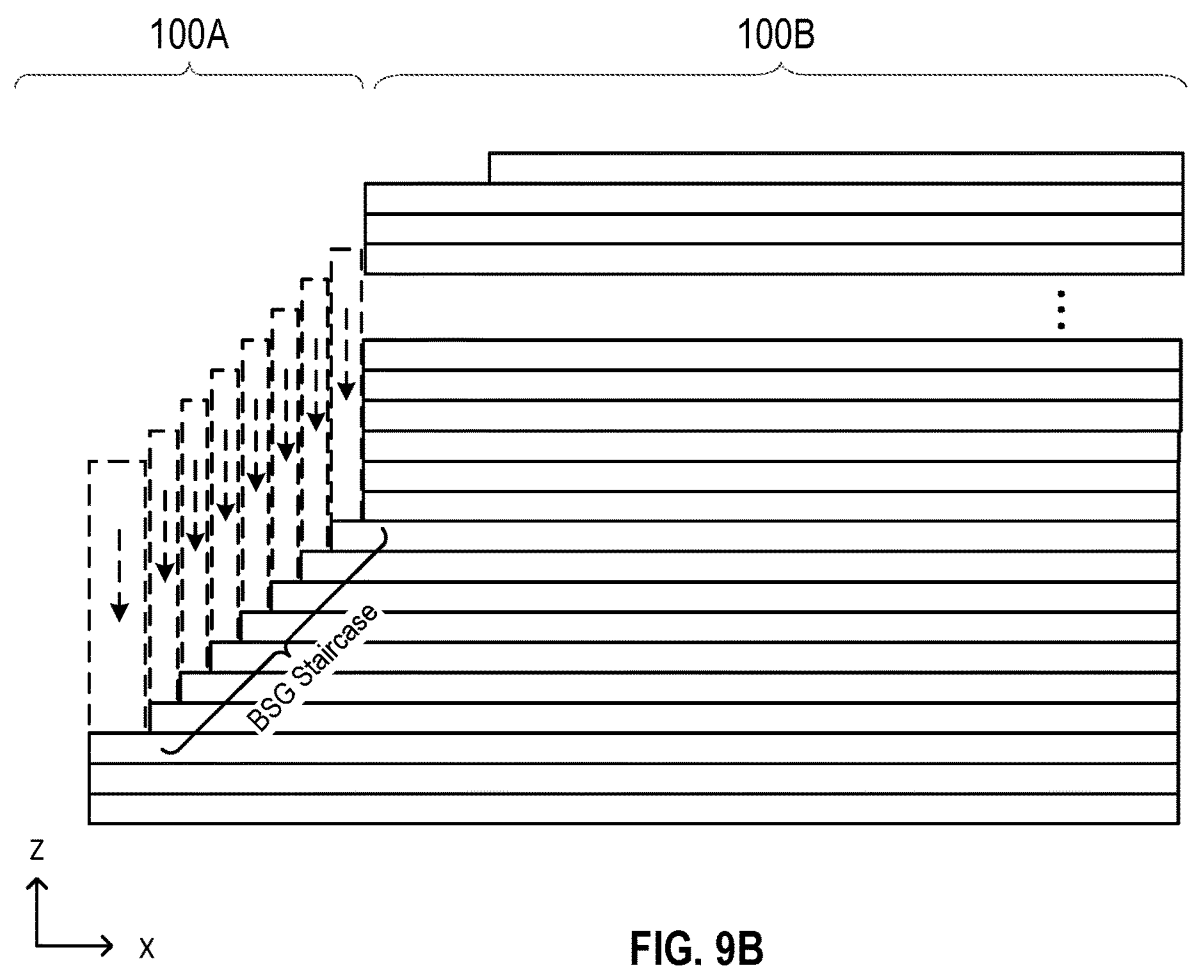

A plurality of removal processes (or chop processes) can subsequently be applied on the first initial BSG staircase, the second initial BSG staircase, and the initial connection staircases to shift the first initial BSG staircase, the second initial BSG staircase, and the initial connection staircases along a vertical direction (e.g., Z direction) toward the substrate 101. In some embodiments, a removal process (or chop process) can be a dry etch process, such as a blanket plasma etching process that can transfer a pattern vertically. FIGS. 9A and 9B are schematic views illustrating the removal processes to shift the first initial BSG staircase from one or more top sacrificial word line layers and top insulating layers to one or more bottom most sacrificial word line layers and bottom most insulating layers in the initial stack.

As shown in FIG. 9A, the first initial BSG staircase can be positioned in the first connection region 100A and include seven stairs (or tiers) that are formed in seven top tiers of the initial stack. Each stair/tier can include a pair of a sacrificial word line layer and an insulating layer. As shown in FIG. 9B, a number of removal processes (or chop processes) can be applied on the first initial BSG staircase to remove portions of the sacrificial word line layers and insulating layers in the first connection region 100A, and the pattern of the first initial BSG staircase can be transferred along the Z direction toward the substrate 101. It should be noted that, a mask layer (not shown) can be positioned over the first array region 100B when the removal processes are applied on the first initial BSG staircase.

In an example of the disclosure, a first removal process can remove seven tiers of sacrificial word line layers and insulating layers. A second removal process subsequent to the first removal process can remove 14 tiers of sacrificial word line layers and insulating layers. A third removal process subsequent to the second removal process can remove 28 tiers of sacrificial word line layers and insulating layers. A fourth removal process subsequent to the third removal process can remove 56 tiers of sacrificial word line layers and insulating layers. A fifth removal process subsequent to the fourth removal process can remove 112 tiers of sacrificial word line layers and insulating layers. Thus, by applying a number of the removal processes, the first initial BSG staircase can be shifted from the one or more top sacrificial word line layers and top insulating layers to the one or more bottom most sacrificial word line layers and bottom most insulating layers in the initial stack. In addition, the removal processes can be applied on the initial connection region so that each of the initial connection staircases 130 can be shifted in respective sacrificial word line layers and insulating layers of the initial stack by receiving appropriate number of removal processes.

Figure 10:
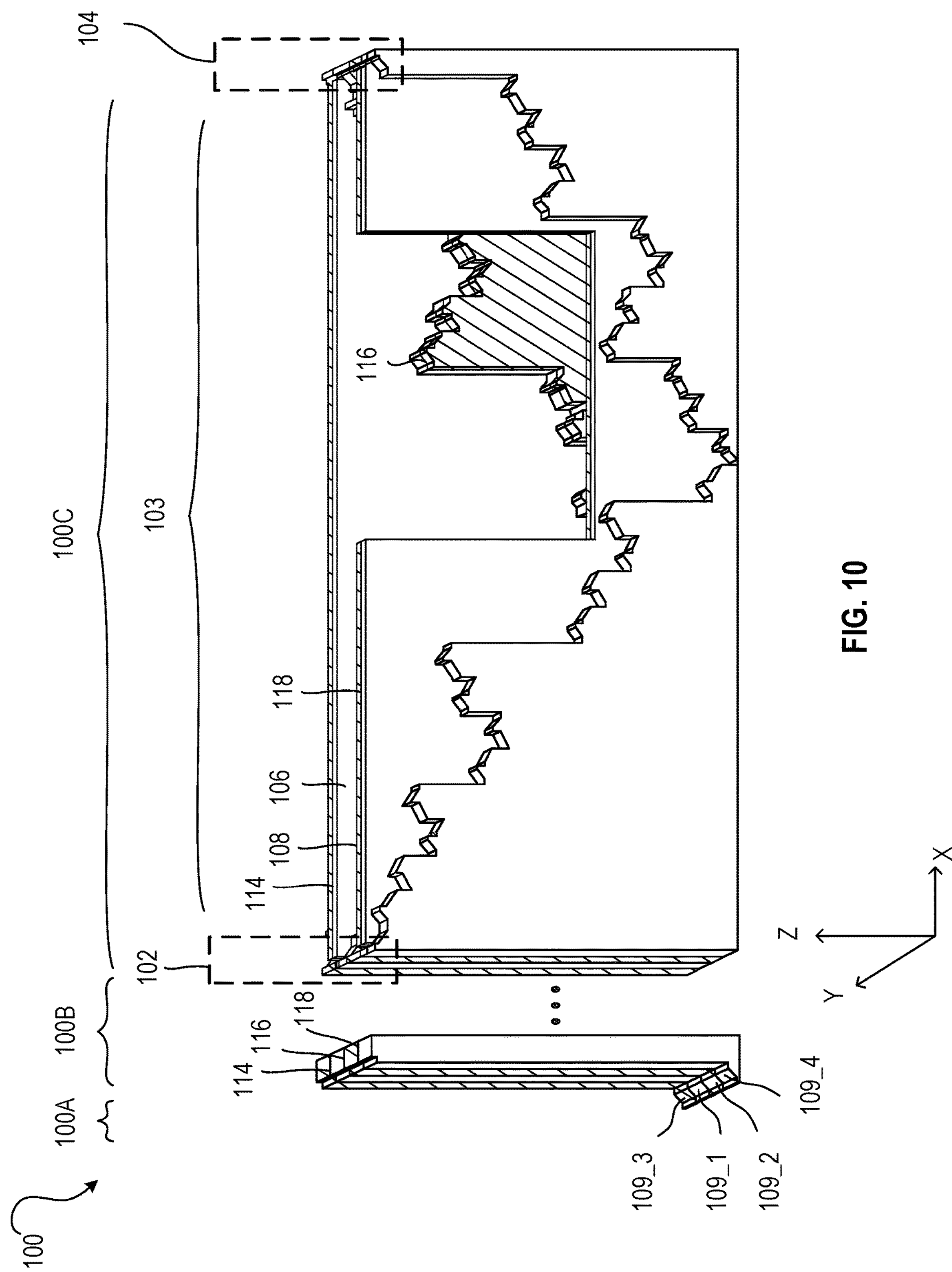

FIG. 10 is a three dimensional view of the semiconductor structure 200 after the removal processes are completed. As shown in FIG. 10, when the removal processes are completed, the first BSG staircase 109 can be formed in the first connection region 100A. In addition, the first TSG staircase 102, connection staircases 103, and the second TSG staircase 104 can be formed in the second connection region 100C. The first BSG staircase 109 can be positioned in the one or more bottom (e.g., bottom most) sacrificial word line layers and bottom insulating layers. The first TSG staircase 102 and the second TSG staircase 104 can be positioned in the one or more top sacrificial word line layers and top insulating layers. Each of the connection staircases 103 can be positioned in respective sacrificial word line layers and insulating layers. Accordingly, the first array region 100B can be positioned between the first BSG staircase 109 and the first TSG staircase 102.

Further, channel structures (e.g., channel structures 128) can be formed in the first array region 100B and the second array region 100D (not shown). A plurality of GLS trenches can be formed in the semiconductor structure 200. The sacrificial word line layers 105 can then be replaced with word line layers. For example, a wet acid can be poured in the structure 200 through the GLS trenches to remove the sacrificial word line layers 105 and form vacancies between the insulating layers 107. The word line layers can then be formed in the vacancies between the insulating layers 107. The word line layers can be made of a first conductive material, such as W or polysilicon.

In some embodiments, the GLS trenches can include a first GLS trench that extends along first sides of the first connection region 100A, the first array region 100B, the second connection region 100C, the second array region 100D, and the third connection region 100E. The GLS trenches can include a second GLS trench that extends through the first connection region 100A, the first array region 100B, the second connection region 100C, the second array region 100D, and the third connection region 100E. The GLS trenches can also include a third GLS trench that extends along second sides of the first connection region 100A, the first array region 100B, the second connection region 100C, the second array region 100D, and the third connection region 100E. The GLS trenches can include first array GLS trenches that are positioned in the first array region 100B and extend in parallel to the first GLS trench and the second GLS trench. The GLS trenches can further include second array GLS trenches that are positioned in the second array region 100D and extend in parallel to the first GLS trench and the second GLS trench.

The GSL trenches can then be filled with a second conductive material, such as polysilicon. Accordingly, a first separation structure (e.g., the first separation structure 114)

can be formed in the first GLS trench, a second separation structure (e.g., the second separation structure 116) can be formed in the second GLS trench, a third separation structure (e.g., the third separation structure 118) can be formed in the third GLS trench. In addition, first array separation structures 120-123 and second array separation structure 124-127 can be formed in the first array region 100B and the second array region 100D, respectively.

In the disclosure, a plurality of word line contacts (not shown) can subsequently be formed along the vertical direction (e.g., Z direction), where the word line contacts can extend from the first TSG staircase 102, the second TSG staircase 104, the first BSG staircase 109, the second BSG staircase 111, and the connection staircase 103 so as to be coupled to the word line layers. When the word line contacts are formed, a 3D NAND device 100 can be formed based on the semiconductor structure 200, as shown in FIG. 10. The 3D NAND device 100 illustrated in FIG. 10 can have similar configurations to the 3D NAND device 100 illustrated in FIGS. 1 and 2.

Figure 11:
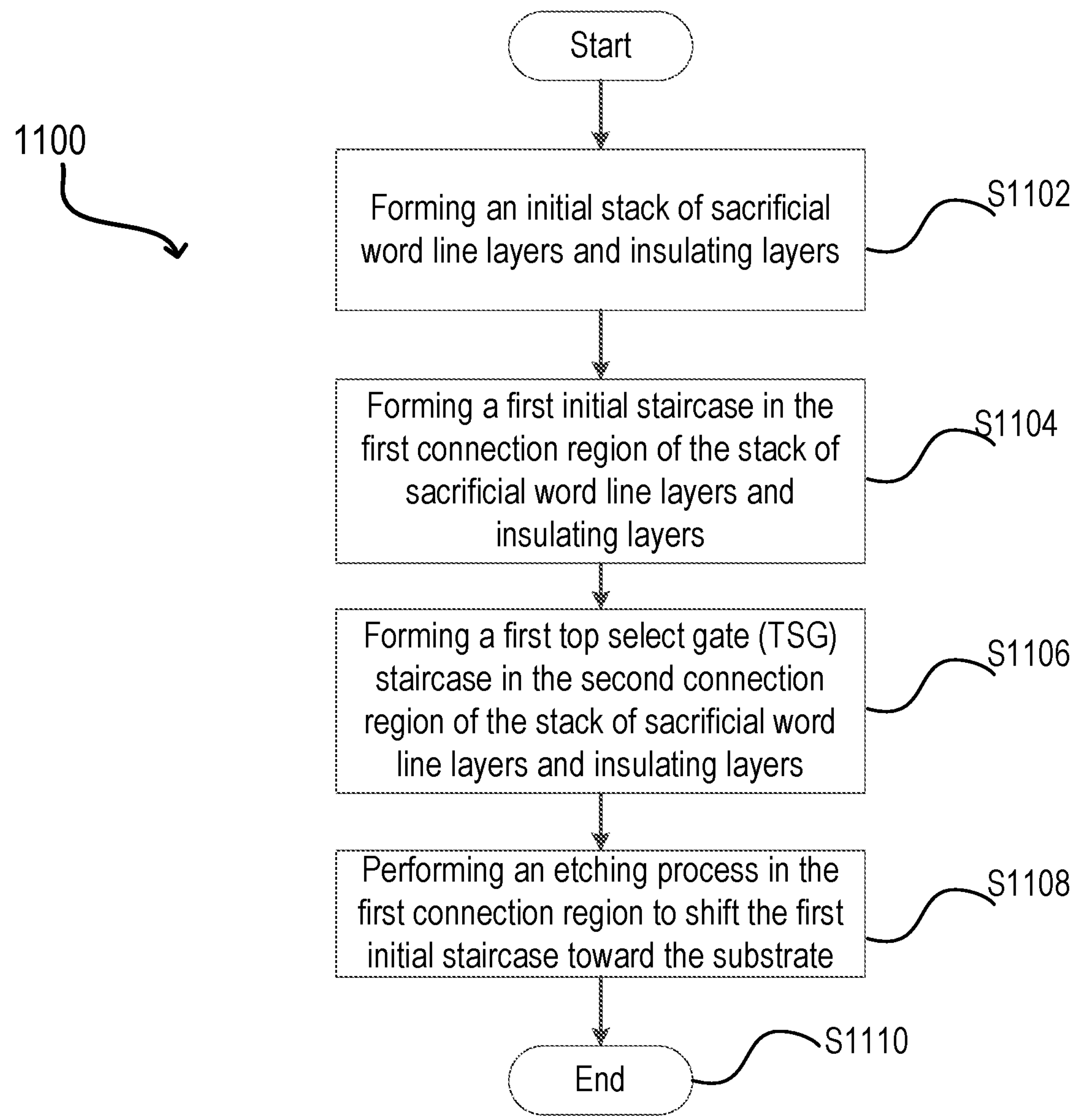
FIG. 11 is a flowchart of a process for manufacturing a 3D NAND device, in accordance with exemplary embodiments of the disclosure.

FIG. 11 is a flowchart of a process 1100 for manufacturing the disclosed 3D NAND device in accordance with some embodiments of the present disclosure. The process 1100 begins at step S1102 where an initial stack of sacrificial word line layers and insulating layers can be formed over a substrate of the 3D NAND device. The initial stack can include a first connection region, a first array region, and a second connection region that are disposed sequentially along a first direction of the substrate. In some embodiments, the steps S1102 can be performed as illustrated with reference to FIGS. 4-5.

At step S1104, a first initial staircase can be formed in the first connection region of the initial stack. The first initial staircase can be formed in a first group of the sacrificial word line layers and the insulating layers. At step S1106, a first top select gate (TSG) staircase can be formed in the second connection region of the initial stack. The first TSG staircase can be formed in a second group of the sacrificial word line layers and the insulating layers. In some embodiments, the steps S1104 and S1106 can be performed as illustrated with reference to FIGS. 6-8.

The process 1100 then proceeds to step S1108 where an etching process can be performed in the first connection region to shift the first initial staircase toward the substrate along a vertical direction perpendicular to the substrate so as to form a first bottom select gate (BSG) staircase. In some embodiments, the step S1108 can be performed as illustrated with reference to FIGS. 9A, 9B, and 10.

It should be noted that additional steps can be provided before, during, and after the process 1100, and some of the steps described can be replaced, eliminated, or performed in different order for additional embodiments of the process 1100. For example, at step S1106, a plurality of initial connection staircases can be formed in the second connection region. At step S1108, the initial connection staircases can be shifted by the etching process toward the substrate to form connection staircases, where each of the connection staircases can be formed in respective sacrificial word line layers and insulating layers.

In addition, channel structures can be formed after the formation of the BSG staircase and the connection staircase. The sacrificial word line can further be replaced with word line layers, and a plurality of separation structures (or GLS structures) can be formed afterwards. Moreover, various additional interconnect structures (e.g., metallization layers having conductive lines and/or vias) may be formed over the first and second contact structures of the 3D NAND device. Such interconnect structures electrically connect the 3D NAND device with other contact structures and/or active devices to form functional circuits. Additional device features such as passivation layers, input/output structures, and the like may also be formed.

The various embodiments described herein offer several advantages over related 3D NAND devices. For example, in the related 3D NAND devices, a BSG staircase and a TSG staircase are normally formed separately from connection staircases. In the disclosure, an initial BSG staircase, a TSG staircase, and initial connection staircases can be formed in a same time through a trim-etch process. A removal process (e.g., a chop process) can subsequently be applied to shift the initial BSG staircase to one or more word line layers and insulating layers (e.g., bottom most word line layers and bottom most insulating layers) so as to form a BSG staircase. The process can also shift the initial connection staircases toward the substrate to form connection staircases, where each of the connection staircases can be formed in respective word line layers and insulating layers of the stack. Thus the method of the disclosure allows the BSG staircase, the TSG staircase, and/or the connection staircase to be formed in a same time. The method of the disclosure can gain both a throughput improvement and a cost reduction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:

forming an initial stack of sacrificial layers and insulating layers that are alternatingly disposed over a substrate, the initial stack including a first connection region, a first array region, and a second connection region that are disposed sequentially along a first direction of the substrate;

forming a first initial staircase in the first connection region of the initial stack, the first initial staircase being formed in a first group of the sacrificial layers and the insulating layers;

forming a first top select gate (TSG) staircase in the second connection region of the initial stack, the first TSG staircase being formed in a second group of the sacrificial layers and the insulating layers;

performing an etching process in the first connection region to shift the first initial staircase toward the substrate along a vertical direction perpendicular to the substrate so as to form a first bottom select gate (BSG) staircase;

forming at least one stop layer on the initial stack, the at least one stop layer defining the first connection region, the first array region, and the second connection region in the initial stack; and performing a trim-etch process based on the at least one stop layer to form a plurality of wall structures, and initial connection staircases in the second connection region, the wall structures being covered by the at least one stop layer, and the initial connection staircases being uncovered and arranged between the wall structures along a second direction of the substrate that is perpendicular to the first direction.

2. The method of claim 1, wherein the performing the etching process comprises:

performing the etching process on the first group of the sacrificial layers and the insulating layers and the second group of the sacrificial layers and the insulating layers to shift the first initial staircase to one or more bottom most sacrificial layers and bottom most insulating layers and to shift the initial connection staircases towards the substrate along the vertical direction to form connection staircases, each of the connection staircases being formed in respective sacrificial layers and insulating layers of the initial stack.

3. The method of claim 2, wherein the performing the etching process further comprises:

performing a plurality of chop processes sequentially to shift the first initial staircase in the first connection region towards the substrate to form the first BSG staircase, wherein:

a first chop process of the chop processes shifts the first initial staircase by a first number of steps towards the substrate; and a second chop process of the chop processes subsequent to the first chop process shifts the first initial staircase by a second number of steps that is as twice as the first number of steps.

4. The method of claim 3, wherein the chop processes are further applied on the initial connection staircases in the second connection region to shift the initial connection staircases towards the substrate so as to form the connection staircases, each of the initial connection staircases receiving respective number of chop processes so that each of the initial connection staircases is shifted in respective sacrificial layers and insulating layers.

5. The method of claim 4, further comprising:

forming first separation structures extending through the first connection region, the first array region, and the second connection region, the first separation structures being formed along the first direction and extending through the initial stack into the substrate.

6. The method of claim 5, further comprising:

forming second separation structures in the first array region, the second separation structures being disposed along the first direction, and positioned between the first separation structures, the second separation structures extending through the initial stack into the substrate, and further extending through the first BSG staircase and the first TSG staircase.

7. The method of claim 1, further comprising:

forming channel structures in the first array region of the initial stack, the channel structures extending through the initial stack into the substrate along the vertical direction.

8. The method of claim 5, wherein the initial stack further includes a second array region and a third connection region, the second array region being positioned between the second connection region and the third connection region; and the method further comprises:

forming a second initial staircase in the third connection region, and a second TSG staircase in the second connection region, the first initial staircase and the second initial staircase being formed in the first group of the sacrificial layers and the insulating layers, the first TSG staircase, the second TSG staircase and the initial connection staircases being formed in the second group of the sacrificial layers and the insulating layers; and performing the etching process to shift the first initial staircase, the second initial staircase, and the initial connection staircases towards the substrate along the vertical direction so as to form the first BSG staircase in the first connection region, a second BSG staircase in the third connection region, and the connection staircases in the second connection region.

9. The method of claim 8, wherein:

the first TSG staircase, the connection staircases, and the second TSG staircase extend along the first direction, the connection staircases being disposed between the first TSG staircase and the second TSG staircase; and the first separation structures further extend through the second array region and the third connection region.

10. The method of claim 8, further comprising:

forming third separation structures in the second array region, the third separation structures being disposed along the first direction, and positioned between the first separation structures, the third separation structures extending through the initial stack into the substrate, and further extending through the second BSG staircase and the second TSG staircase.

11. A method for fabricating a semiconductor device, comprising:

forming an initial stack of sacrificial layers and insulating layers that are alternatingly disposed over a substrate, the initial stack including a first connection region, a first array region, a second connection region, a second array region, and a third connection region that are disposed sequentially along a first direction of the substrate;

forming a first initial staircase in the first connection region and a second initial staircase in the third connection region, the first initial staircase and the second initial staircase being formed in a first group of the sacrificial layers and the insulating layers;

forming a first top select gate (TSG) staircase in the second connection region along the first array region and a second TSG staircase in the second connection region along the second array region, the first TSG staircase and the second TSG staircase being formed in a second group of the sacrificial layers and the insulating layers; and performing an etching process in the first connection region and the third connection region to shift the first initial staircase and the second initial staircase toward the substrate along a vertical direction perpendicular to the substrate so as to form a first bottom select gate (BSG) staircase in the first connection region and a second BSG staircase in the third connection region.

12. The method of claim 11, further comprising:

forming at least one stop layer on the initial stack, the at least one stop layer defining the first connection region, the first array region, the second connection region, the second array region, and the third connection region in the initial stack; and performing a trim-etch process based on the at least one stop layer to form a plurality of wall structures, and initial connection staircases in the second connection region that are positioned between the first array region and the second array region, the wall structures being covered by the at least one stop layer, and the initial connection staircases being uncovered and further arranged between the wall structures.

13. The method of claim 12, the performing the etching process comprises:

performing the etching process on the first group of the sacrificial layers and the insulating layers of the first initial staircase and the second initial staircase to shift the first initial staircase and the second initial staircase to one or more bottom most sacrificial layers and bottom most insulating layers; and performing the etching process on the second group of the sacrificial layers and the insulating layers to shift the initial connection staircases towards the substrate along the vertical direction to form connection staircases, each of the connection staircases being formed in respective sacrificial layers and insulating layers of the initial stack.

14. The method of claim 13, wherein the performing the etching process further comprises:

performing a plurality of chop processes sequentially to shift the first initial staircase and the second initial staircase towards the substrate to form the first BSG staircase and the second BSG staircase respectively, wherein:

a first chop process of the chop processes shifts the first initial staircase and the second initial staircase by a first number of steps respectively towards the substrate; and a second chop process of the chop processes subsequent to the first chop process shifts the first initial staircase and the second initial staircase by a second number of steps respectively, the second number of steps being as twice as the first number of steps.

15. The method of claim 14, wherein the chop processes are further applied on the initial connection staircases in the second connection region to shift the initial connection staircases towards the substrate so as to form the connection staircases, each of the initial connection staircases receiving respective number of chop processes so that each of the initial connection staircases is shifted in respective sacrificial layers and insulating layers.

16. The method of claim 15, further comprising:

forming first separation structures extending through the first connection region, the first array region, the second connection region, the second array region, and the third connection region, the first separation structures being formed along the first direction and extending through the initial stack into the substrate.

17. The method of claim 16, further comprising:

forming second separation structures in the first array region and the second array region, the second separation structures being disposed along the first direction and extending through the initial stack into the substrate, and further extending through the first BSG staircase and the first TSG staircase.

18. The method of claim 11, further comprising:

forming channel structures in the first array region and second array region of the initial stack, the channel structures extending through the initial stack into the substrate along the vertical direction.

* * * * *